US012136917B2

(12) United States Patent
Chatterjee et al.

(10) Patent No.: US 12,136,917 B2
(45) Date of Patent: Nov. 5, 2024

(54) VOLTAGE LEVEL SHIFTER FOR SUB-THRESHOLD OPERATION

(71) Applicant: STMicroelectronics International N.V., Geneva (CH)

(72) Inventors: Kallol Chatterjee, Kolkata (IN); Rohit Kumar Gupta, Noida (IN)

(73) Assignee: STMicroelectronics International N.V., Geneva (CH)

( * ) Notice: Subject to any disclaimer, the term of this patent is extended or adjusted under 35 U.S.C. 154(b) by 28 days.

(21) Appl. No.: 18/151,337

(22) Filed: Jan. 6, 2023

(65) Prior Publication Data

US 2023/0231559 A1 Jul. 20, 2023

Related U.S. Application Data

(60) Provisional application No. 63/299,833, filed on Jan. 14, 2022.

(51) Int. Cl.
*H03K 19/0185* (2006.01)
(52) U.S. Cl.
CPC .............. *H03K 19/018521* (2013.01)
(58) Field of Classification Search
None
See application file for complete search history.

(56) References Cited

U.S. PATENT DOCUMENTS

| | | | | |
|---|---|---|---|---|
| 7,148,735 B2 * | 12/2006 | Ito | ............... | H03K 3/011 327/333 |
| 7,511,552 B2 * | 3/2009 | Ali | ............... | H03K 3/356182 326/62 |
| 8,115,514 B2 * | 2/2012 | Deng | ............... | H03K 3/356113 326/83 |
| 8,564,357 B2 | 10/2013 | Kimoto | | |
| 8,581,627 B2 | 11/2013 | Panov | | |
| 8,854,104 B2 | 10/2014 | Chung et al. | | |
| 9,800,246 B2 | 10/2017 | Roham et al. | | |

\* cited by examiner

*Primary Examiner* — Kenneth B Wells
(74) *Attorney, Agent, or Firm* — Seed IP Law Group LLP

(57) ABSTRACT

Provided is a voltage level shifter that operates in sub-threshold voltages. The level shifter includes a level shifting stage. The level shifting stage receives a first signal from a first voltage domain and outputs a second signal to a second voltage domain. The level shifter includes a first auxiliary stage. In response to the first signal having a first voltage level corresponding to a first logical state and a first node of the level shifting stage having a supply voltage level, the first auxiliary stage sources current to a second node of the level shifting stage. Sourcing the current to the second node accelerates a transition of the first node to a reference voltage. The level shifting stage outputs a second signal to a second voltage domain.

16 Claims, 9 Drawing Sheets

VOLTAGE LEVEL SHIFTER FOR SUB-THRESHOLD OPERATION

BACKGROUND

Technical Field

The present application is directed to a voltage level shifter and, in particular, a voltage level shifter that operates using input signals having voltage levels below a threshold voltage of level shifter transistors.

Description of the Related Art

Systems and devices are increasingly designed to use lower supply voltages. Voltage level shifters are used for interoperability between these systems and devices and other systems and devices that are supplied with higher supply voltages. For example, a low-to-high voltage level shifter may be used to translate signals from a lower voltage domain to a higher voltage domain. Conversely, a high-to-low voltage level shifter may be used to translate signals from a higher voltage domain to a lower voltage domain.

BRIEF SUMMARY

Provided herein is a voltage level shifter. The level shifter translates voltages from a first domain to a second domain. The first domain may operate using voltage levels that are less than a threshold voltage of transistors of the level shifter. The threshold voltage is a control terminal voltage (e.g., gate voltage) of a transistor at which the transistor starts to become fully conductive.

The level shifter transitions between states in an expedited manner. The level shifter includes auxiliary stages for its nodes. A first auxiliary stage detects whether a first node has not transitioned between states when in fact the first node should have transitioned between states. The first auxiliary stage performs the detection based on a voltage of the first node and an input signal to the level shifter.

When the first auxiliary stage detects the scenario, the first auxiliary stage sources or supplies current to the level shifter to aid the level shifter in transitioning between states. For example, the first auxiliary stage may supply the current to a second node of the level shifter. The second node transitions between states as a result of being supplied with the current. The transition of the second node triggers the first node to transition between states. The auxiliary stages ensure that the level shifter transitions between states, in response to input signals, in an expedited manner. A node may not take an extended duration of time to transition between states. That is due to the fact that the auxiliary stage identifies a mismatch or a lack of correspondence between the state of the node and the input signal when the mismatch occurs and aids or facilitates transition of the node.

DETAILED DESCRIPTION

Figure 1:
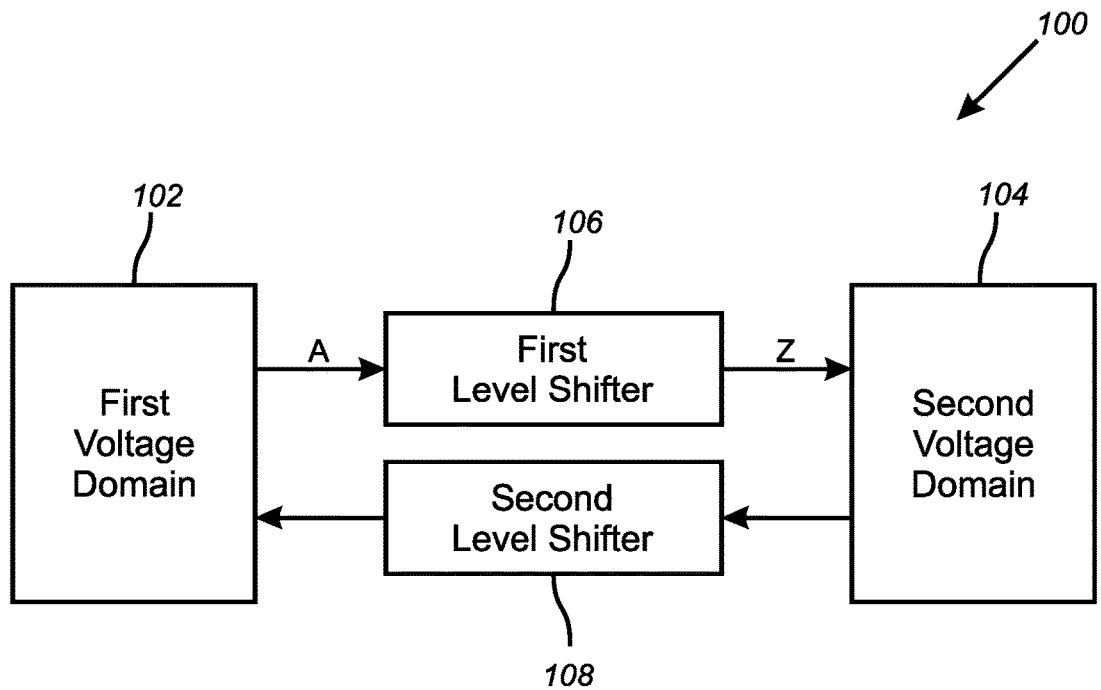
FIG. 1 shows a block diagram of a system having different voltage domains.

FIG. 1 shows a block diagram of a system 100 having different voltage domains. The voltage domains include a first voltage domain 102 and a second voltage domain 104. The system 100 includes first and second level shifters 106, 108 coupled between the first and second voltage domains 102, 104. The first voltage domain 102 may include circuits, electronic components or devices, among others, that use a first range of operational voltages. For example, the first voltage domain 102 may include one or more processors, one or more sensors or digital logic that are supplied with a first supply voltage (Vdd1) within the first range of operational voltages. Further, the signals generated by the first voltage domain 102 may have voltage levels within the first range of operational voltages. The second voltage domain 104 may include circuits, electronic components or devices, among others, that are supplied with a second supply voltage (Vdd2) within a second range of operational voltages that is different from the first range of operational voltages.

The first level shifter 106 may be any circuit operative to translate or transition signals or logic states from the first voltage domain 102 to the second voltage domain 104. The second level shifter 108 may be any circuit operative to translate or transition signals or logic states from the second voltage domain 104 to the first voltage domain 102.

Whereas the first level shifter 106 may be characterized as a low-to-high level shifter, the second level shifter 108 may be characterized as a high-to-low level shifter due to the fact that the second level shifter 108 translates a signal from a voltage domain having a higher voltage to a voltage domain having a lower voltage.

The first level shifter 106 (referred to hereinafter as 'level shifter 106') receives a first signal (A) from the first voltage domain 102. The first signal (A) may have a logical state (e.g., logical zero or logical one) that is set in accordance with the first range of operational voltages. The level shifter 106 outputs a second signal (Z) that has the same logical state set in accordance with the second range of operational voltages of the second voltage domain 104. For example, the first range of operational voltages may be between 0.40 and 1.05 volts (V), whereas the second range of operational voltages may be between 1.58V and 3.60V. Continuing with the example, the level shifter 106 may translate the first signal (A) having a voltage of 0.40V into the second signal (Z) having a voltage of 3.60V, among other translations.

The level shifter 106 may include an input stage and an output stage. The input stage may buffer and invert the first signal (A), and the output stage may buffer a node voltage of the level shifter 106 as described herein to produce the second signal (Z).

Figure 2:
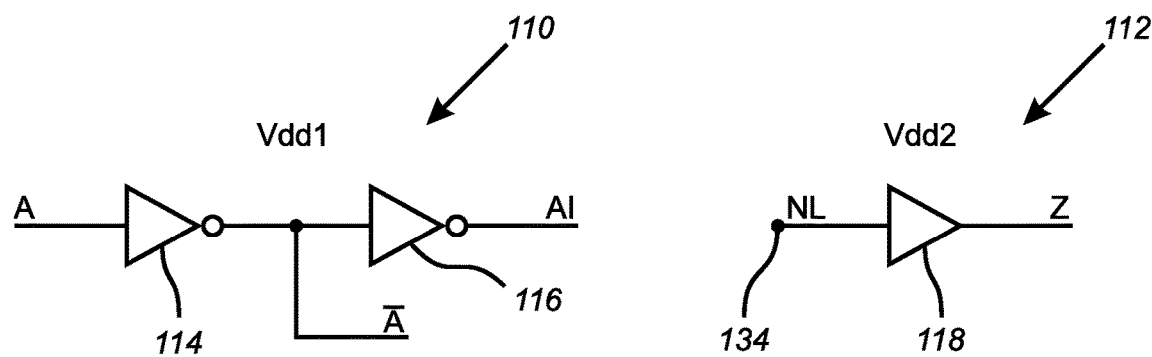
FIG. 2 shows an input stage and an output stage of a level shifter.

FIG. 2 shows an input stage 110 and an output stage 112 of the level shifter 106. The input stage 110 includes first and second inverters 114, 116. The output stage 112 includes a buffer 118. The first inverter 114 has an input for receiving the first signal (A) and an output. The output of the first inverter 114 provides a complementary first signal ($\overline{A}$) for operating the level shifter 106. The second inverter 116 has an input coupled to the output of the first inverter 114. The second inverter 116 has an output for providing the first signal (AI) having undergone buffering (referred to herein for brevity as 'the first signal (AI)') for operating/controlling the level shifter 106. The input stage 110 may be supplied with the first supply voltage (Vdd1) of the first voltage domain 102 that is within the first range of operating voltages. The output stage 112 includes a buffer 118. The buffer 118 may be supplied with the second supply voltage (Vdd2) of the second voltage domain 104 that is within the second range of operating voltages. The buffer 118 has an input and an output. The input of the buffer 118 is coupled to a node (denoted 'NL') of the level shifter 106 as described herein. The buffer 118 buffers a voltage of the node and outputs the second signal (Z).

It is noted that the input stage 110 and/or the output stage 112 may be part of the level shifter 106. Alternatively, the input stage 110 may be part of the first voltage domain 102 and/or the output stage 112 may be part of the second voltage domain 104. In some embodiments, use of the input and output stages 110, 112 and buffering thereof may be forgone.

Figure 3:
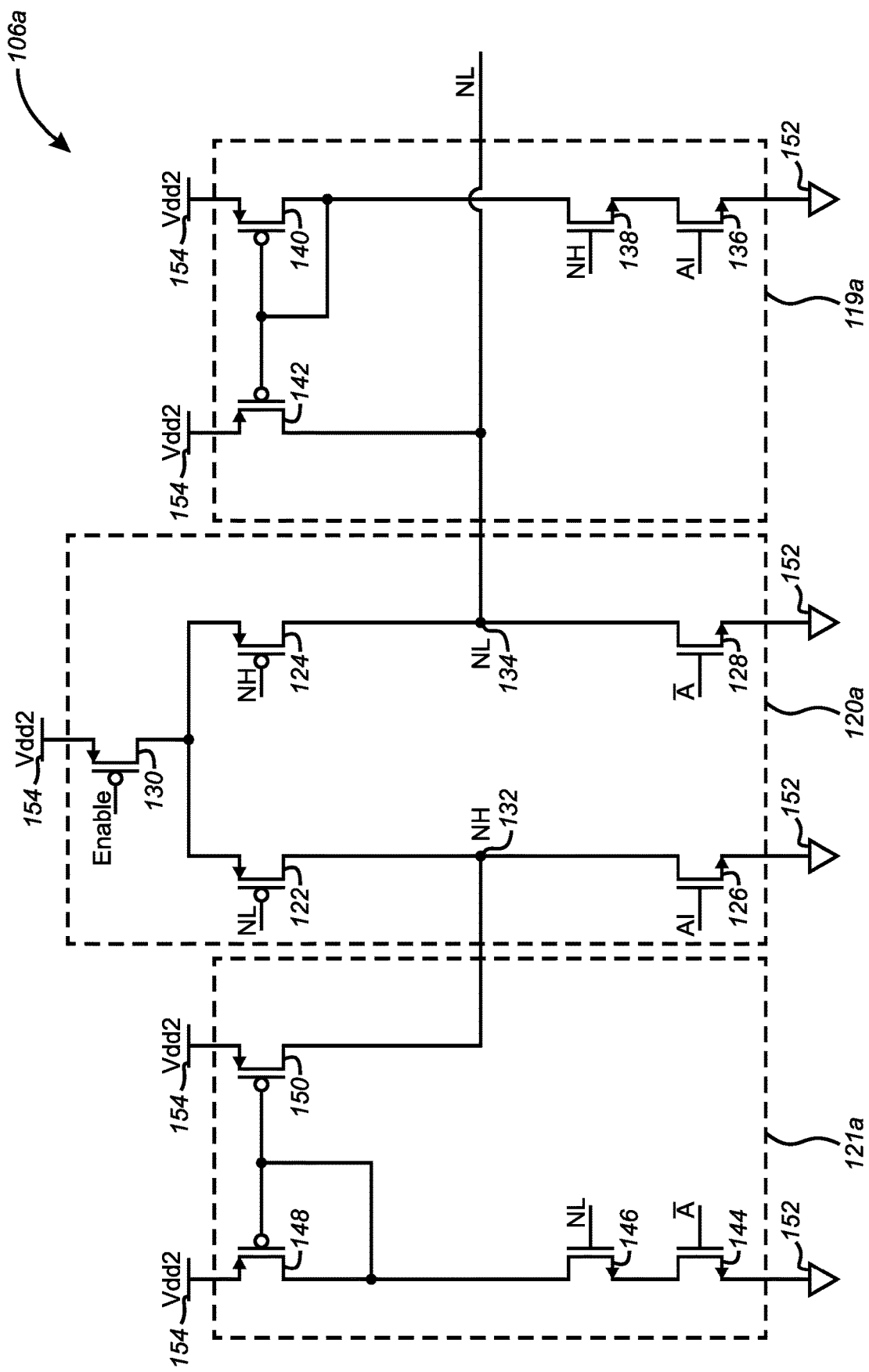
FIG. 3 shows a level shifter in accordance with an embodiment.

FIG. 3 shows a level shifter 106a in accordance with an embodiment. The level shifter 106a includes a half-latch stage 120a and first and second auxiliary stages 119a, 121a. It is noted that although a half-latch circuit is shown as a level shifting stage, any other type of level shifting circuit may be used for the level shifting stage. The half-latch stage 120a includes first and second cross-coupled transistors 122, 124, first and second input transistors 126, 128, an enable transistor 130 and first and second nodes 132, 134. The first auxiliary stage 119a includes first and second input transistors 136, 138 and first and second current mirror transistors 140, 142. The second auxiliary stage 121a includes first and second input transistors 144, 146 and first and second current mirror transistors 148, 150. The level shifter 106a is coupled to a reference voltage node 152 and a supply voltage node 154. The reference voltage node 152 may provide a reference voltage, such as ground. The supply voltage node 154 provides a supply voltage to the level shifter 106a, whereby the supply voltage may be the second supply voltage (Vdd2) of the second voltage domain 104. The level shifter 106a may generally be supplied with the supply voltage of the domain to which the level shifter 106a outputs a signal or a logical state.

In the half-latch stage 120a, the first input transistor 126 has a first conduction terminal coupled to the first node 132, a second conduction terminal coupled to the reference voltage node 152 and a control terminal configured to receive the first signal (AI). The second input transistor 128 has a first conduction terminal coupled to the second node 134, a second conduction terminal coupled to the reference voltage node 152 and a control terminal configured to receive the complementary first signal ($\overline{A}$).

The first cross-coupled transistor 122 has a first conduction terminal, a second conduction terminal coupled to the first node 132 and a control terminal coupled to the second node 134. The second cross-coupled transistor 124 has a first conduction terminal, a second conduction terminal coupled to the second node 134 and a control terminal coupled to the first node 132. The enable transistor 130 has a first conduction terminal coupled to the supply voltage node 154. The enable transistor 130 has a second conduction terminal coupled to both the first conduction terminal of the first cross-coupled transistor 122 and the first conduction terminal of the second cross-coupled transistor 124. The enable transistor 130 has a control terminal configured to receive an enable signal (Enable).

In the first auxiliary stage 119a, the first input transistor 136 has a first conduction terminal coupled to the reference voltage node 152 and a control terminal configured to receive the first signal (AI). The first input transistor 136 has a second conduction terminal. The second input transistor 138 has a first conduction terminal coupled to the second conduction terminal of the first input transistor 136. The second input transistor 138 has a control terminal coupled to the first node 132. The second input transistor 138 has a second conduction terminal.

In the first auxiliary stage 119a, the first current mirror transistor 140 has a first conduction terminal coupled to the second conduction terminal of the second input transistor 138. The first current mirror transistor 140 has a second conduction terminal coupled to the supply voltage node 154. The first current mirror transistor 140 has a control terminal coupled to its first conduction terminal. The second current mirror transistor 142 has a first conduction terminal coupled to the second node 134 and a second conduction terminal coupled to the supply voltage node 154. The second current mirror transistor 142 has a control terminal coupled to both the control terminal and the first conduction terminal of the first current mirror transistor 140.

In the second auxiliary stage 121a, the first input transistor 144 has a first conduction terminal coupled to the reference voltage node 152 and a control terminal configured to receive the complementary first signal ($\overline{A}$). The first input transistor 144 has a second conduction terminal. The second input transistor 146 has a first conduction terminal coupled to the second conduction terminal of the first input transistor 144. The second input transistor 146 has a control terminal coupled to the second node 134. The second input transistor 146 has a second conduction terminal.

In the second auxiliary stage 121a, the first current mirror transistor 148 has a first conduction terminal coupled to the second conduction terminal of the second input transistor 146. The first current mirror transistor 148 has a second conduction terminal coupled to the supply voltage node 154. The first current mirror transistor 148 has a control terminal coupled to its first conduction terminal. The second current mirror transistor 150 has a first conduction terminal coupled to the first node 132 and a second conduction terminal coupled to the supply voltage node 154. The second current mirror transistor 150 has a control terminal coupled to both the control terminal and the first conduction terminal of the first current mirror transistor 148.

In the half-latch stage 120a, the enable signal (Enable) switches the enable transistor 130 between the on and off states. When the enable transistor 130 is switched on, the enable transistor 130 sources current from the supply voltage node 154 to the first and second cross-coupled transistors 122, 124 thereby powering the level shifter 106a. Conversely, when the enable transistor 130 is switched off, the enable transistor 130 cuts off the current.

During operation, the half-latch stage 120a receives the first signal (AI) and the complementary first signal ($\overline{A}$). The first signal (AI) and the complementary first signal ($\overline{A}$) have complementary states. The states have voltage levels set in accordance with the first range of operational voltages of the first voltage domain 102. For example, if the first signal (AI) is a logical one, the first signal (AI) has a first voltage level corresponding to the first supply voltage (Vdd1) and the complementary first signal ($\overline{AI}$) has a second voltage level of 0V.

When the first voltage level is greater than a threshold voltage (Vt) of the first input transistor 126, the first input transistor 126 becomes conductive pulling the first node 132 down to the reference voltage (e.g., ground). When the first cross-coupled transistor 122 is conductive, the first node 132 is pulled up to the second supply voltage (Vdd2). However, closing the first input transistor 126 forces the first node 132 to the reference voltage. Consequently, a voltage of the first node 132 acts on the second cross-coupled transistor 124 and causes the second cross-coupled transistor 124 to become conductive. The second cross-coupled transistor 124 passes current from the supply voltage node 154 to the second node 134. The current pulls a voltage level of the second node 134 up to the second supply voltage (Vdd2). Thus, when the first signal (AI) has the first voltage level, the second node 134 is pulled up to the second supply voltage (Vdd2) corresponding to a logical one in the second voltage domain 104 (the output domain).

However, when a portion of the first range of operational voltages is below the threshold voltage (Vt) of the first input transistor 126 (or the second input transistor 128), the first input transistor 126 may take a relatively long period of time to become conductive. That is due to the fact that the drain of the first input transistor 126 is coupled to the first node 132 having a voltage pulled up to the second supply voltage (Vdd2). The first input transistor 126 may become partially conductive when the first signal (AI) has the first voltage level (that is below the threshold voltage (Vt)). Partial conduction is also known as sub-threshold conduction (e.g., in a weak inversion region). However, the partial conductivity may not pull the first node 132 down to the reference voltage due to the simultaneous pull, by the first cross-coupled transistor 122, to the second supply voltage (Vdd2).

The first node 132 and the drain of the first input transistor 126 are pulled up to the second supply voltage (Vdd2) as a result of the first cross-coupled transistor 122 being in a conductive state. Consequently, transitioning the first cross-coupled transistor 122 to the non-conductive state aids in accelerating, expediting or hastening pulling the first node 132 to the reference voltage. Transitioning the first cross-coupled transistor 122 to the non-conductive state cuts off the supply of the second supply voltage (Vdd2) to the first node 132.

The first and second auxiliary stages 119a, 121a operate to facilitate transitioning the first and second input transistors 126, 128, respectively, to the conductive state. The first auxiliary stage 119a supplies current to the second node 134 to cause the first cross-coupled transistor 122 to transition to the non-conductive state thereby removing the supply of the second supply voltage (Vdd2) to the first node 132 and facilitating the transition of the first input transistor 126 to the conductive state.

The second auxiliary stage 121a supplies current the first node 132 to cause the second cross-coupled transistor 124 to transition to the non-conductive state thereby removing the supply of the second supply voltage (Vdd2) to the second node 134 and facilitating the transition of the second input transistor 128 to the conductive state.

During operation, the first signal (AI) initially has the second voltage level (e.g., logical zero) corresponding to reference voltage in the first voltage domain 102 and at the same time the first node 132 is pulled up to the second supply voltage (Vdd2) of the second voltage domain 104. The first signal (AI) then transitions to the first voltage level (e.g., logical one) corresponding to the first supply voltage (Vdd1). When the first voltage level is below the threshold voltage (Vt) of the first input transistor 126, the first input transistor 126 may not transition to the conductive state or may take an extended duration of time to transition. The first auxiliary stage 119a hastens the transition by pulling the first node 132 down to the reference voltage of the second voltage domain 104.

The first and second input transistors 136, 138 of the first auxiliary stage 119a are driven by the first signal (AI) and the voltage level of the first node 132, respectively. The first and second input transistors 136, 138 become conductive when the first signal (AI) has the first voltage level and the first node 132 is pulled up to the second supply voltage (Vdd2). That is, the first auxiliary stage 119a operates to detect a scenario in which the first node 132 remains pulled up to the second supply voltage (Vdd2) despite the fact that the first signal (AI) should cause the first node 132 to be pulled to the reference voltage. In this scenario, the first and second input transistors 136, 138 of the first auxiliary stage 119a become conductive to trigger or start operation of the first auxiliary stage 119a.

It is noted that, whereas the first input transistor 126 of the half-latch stage 120a has a drain pulled up to the second supply voltage (Vdd2), the first input transistor 136 of the first auxiliary stage 119a is not pulled up to a supply voltage. The absence of the supply voltage from the drain of the first input transistor 136 makes the first input transistor 136 of the first auxiliary stage 119a more prone to transitioning to the conductive state in response to the first signal (AI) than the first input transistor 126 of the half-latch stage 120a.

When the first and second input transistors 136, 138 are conductive, the control terminals of the first and second current mirror transistors 140 are pulled down to the reference voltage thereby causing the first and second current mirror transistors 140 to become conductive. The second current mirror transistor 142 sources current from the supply voltage node 154 to the second node 134 raising a voltage of the second node 134 to the second supply voltage (Vdd2). The voltage of the second node 134 acts on the first cross-coupled transistor 122 and causes the first cross-coupled transistor 122 to become non-conductive cutting off the first node 132 (and the drain of the first input transistor 126) from the second supply voltage (Vdd2). Having removed the second supply voltage (Vdd2) from the drain of the first input transistor 126, the first input transistor 126 transitions to the conductive state in response to the first signal (AI) having the first voltage level, and the first input transistor 126 pulls the first node 132 down to the reference voltage.

The reference voltage at the first node 132 causes the second cross-coupled transistor 124 to become conductive thereby pulling the second node 134 to the second supply voltage (Vdd2). The output of the level shifter 106a is tapped at the second node 134. Thus, the level shifter 106a performs level shifting and outputs the second supply voltage (Vdd2) corresponding to a logical one in the second voltage domain 104.

Additionally, the reference voltage at the first node 132 causes the second input transistor 138 of the first auxiliary stage 119a to become non-conductive. The second input transistor 138 shuts off the current paths through the first and second current mirror transistors 140, 142. Thus, the first auxiliary stage 119a ceases dynamic power dissipation after pulling the second node 134 up to the second supply voltage (Vdd2) and pulling the first node 132 to the reference voltage.

The second auxiliary stage 121a operates to aid pulling the second node 134 to the reference voltage. The second auxiliary stage 121a is activated when the level shifter 106a outputs a logical one to the second voltage domain 104 and the first signal (AI) transitions to a logical zero. Due to the transition, the complementary first signal ($\overline{A}$) is a logical one and has the first voltage level. However, the second cross-coupled transistor pulls the second node 134 to the second supply voltage (Vdd2). Consequently, the second input transistor 128 may take an extended duration of time to transition to the conductive state.

By operation of the first and second input transistors 144, 146, the second auxiliary stage 121a detects that the complementary first signal ($\overline{A}$) is a logical one and has the first voltage level and also detects that the second node 134 is pulled up to the second supply voltage (Vdd2) (when the node is to be pulled down to the reference voltage in response to the complementary first signal ($\overline{A}$)). When the criterion is met, the second auxiliary stage 121a passes current from the supply voltage node 154 through the first and second current mirror transistors 148, 150. As a result, the first node 132 is brought up to the second supply voltage (Vdd2). The first node 132 acts on the second cross-coupled transistor 124 and causes the second cross-coupled transistor 124 to become non-conductive isolating the second node 134 from the second supply voltage (Vdd2). The second supply voltage (Vdd2) is, thus, removed from the drain of the second input transistor 128, and the complementary first signal ($\overline{A}$) causes the second input transistor 128 to become conductive pulling the second node 134 to the reference voltage (and causing the first cross-coupled transistor 122 to become conductive).

In response to the pulling the second node 134 to the reference voltage, the second input transistor 146 of the second auxiliary stage 121a becomes non-conductive. Thus, the second input transistor 146 stops current dissipation in the second auxiliary stage 121a.

It is noted that although the first and second cross-coupled transistors 122, 124, the enable transistor 130, the first and second current mirror transistors 140, 142 of the first auxiliary stage 119a and the first and second current mirror transistors 148, 150 of the second auxiliary stage 121a are represented as N-channel metal-oxide-semiconductor (nMOS) transistors and the first and second input transistors 126, 128 of the half-latch stage 120a, the first and second input transistors 136, 138 of the first auxiliary stage 119a and the first and second input transistors 144, 146 of the second auxiliary stage 121a are represented as P-channel metal-oxide-semiconductor (pMOS), the transistors of the level shifter 106a may be of any type of transistor.

Figure 4:
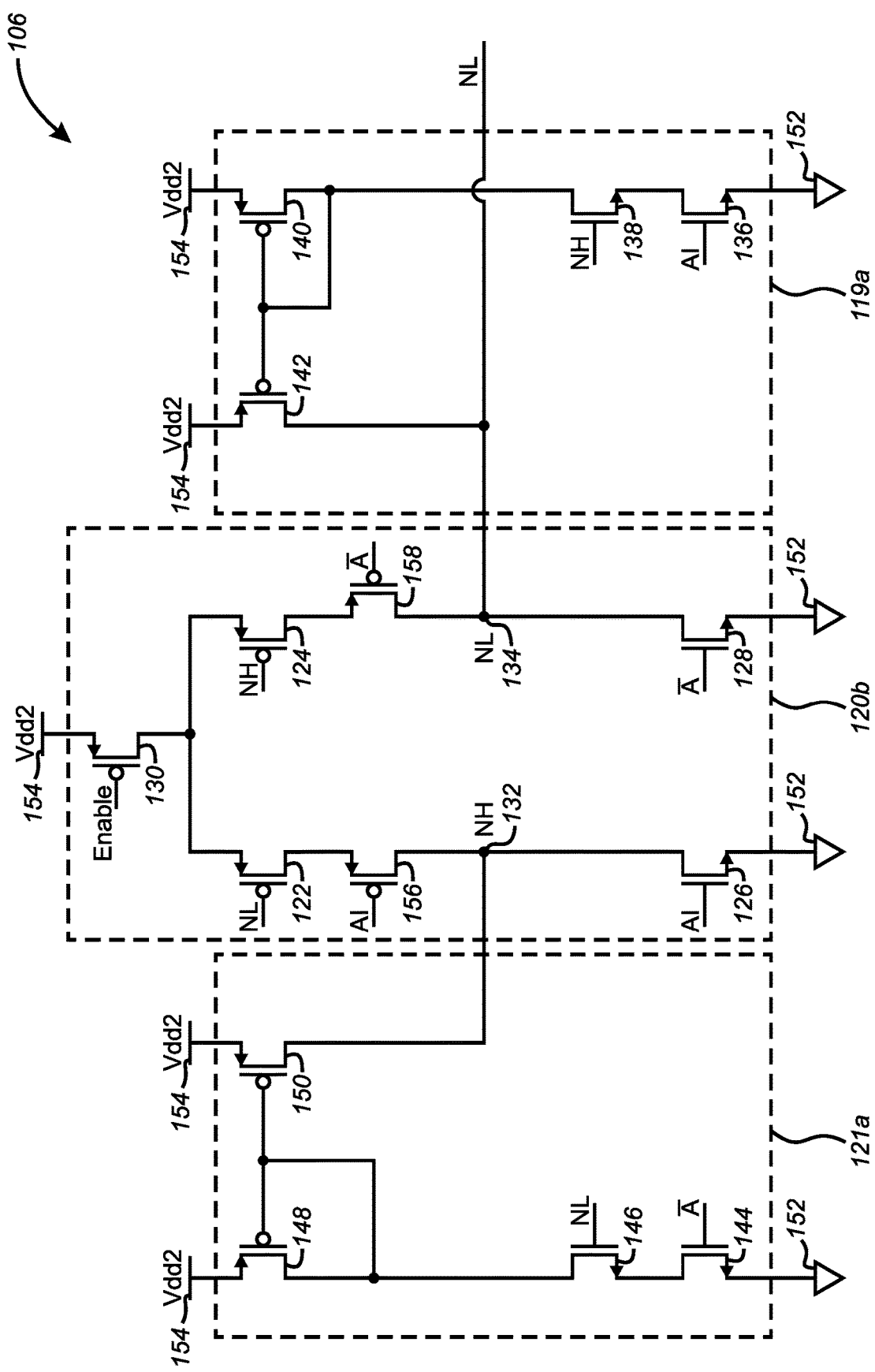
FIG. 4 shows a level shifter in accordance with an embodiment.

FIG. 4 shows a level shifter 106b in accordance with an embodiment. The level shifter 106b includes a half-latch stage 120b and the first and second auxiliary stages 119a, 121a described with reference to FIG. 3. The half-latch stage 120b includes third and fourth input transistors 156, 158. Whereas the first conduction terminal of the first cross-coupled transistor 122 is coupled to the first node 132 in the half-latch stage 120a of the level shifter 106a of FIG. 3, the half-latch stage 120b of the level shifter 106b of FIG. 4 has conduction terminals of the third input transistor 156 intervening therebetween. Similarly, the conduction terminals of the fourth input transistor 158 are coupled between the first conduction terminal of the second cross-coupled transistor 124 and the second node 134.

The third input transistor 156 has a first conduction terminal coupled to the first node 132, a second conduction terminal coupled to the first conduction terminal of the first cross-coupled transistor 122. The third input transistor 156 has a control terminal for receiving the first signal (AI). The fourth input transistor 158 has a first conduction terminal coupled to the second node 134 and a second conduction terminal coupled to the first conduction terminal of the second cross-coupled transistor 124. The fourth input transistor 158 has a control terminal for receiving the complementary first signal ($\overline{A}$).

The third input transistor 156 operates to aid in removing the second supply voltage (Vdd2) from the first node 132 when the first signal (AI) has the first voltage level. In response to the first voltage level being less than the threshold voltage (Vt) of the third input transistor 156, the third input transistor 156 may become partially off and weaken the pull up of the first node 132 to the second supply voltage (Vdd2). This, in turn, aids the transition of the first input transistor 126 to the conductive state when the first voltage level is similarly less than the threshold voltage (Vt) of the first input transistor 126. The first and third input transistors 126, 156 become partially conductive. The first and third input transistors 126, 156 concurrently weaken the pulling the first node 132 to the second supply voltage (Vdd2) and strengthen pulling the first node 132 to the reference voltage.

The fourth input transistor 158 also operates to aid in removing the second supply voltage (Vdd2) from the second node 134 when the complementary first signal ($\overline{A}$) has the first voltage level. In response to the first voltage level being less than the threshold voltage (Vt) of the fourth input transistor 158, the fourth input transistor 158 may become partially off and weaken the pull up of the second node 134 to the second supply voltage (Vdd2). This, in turn, aids the transition of the second input transistor 128 to the conductive state when the first voltage level is similarly less than the threshold voltage (Vt) of the second input transistor 128.

Figure 5:
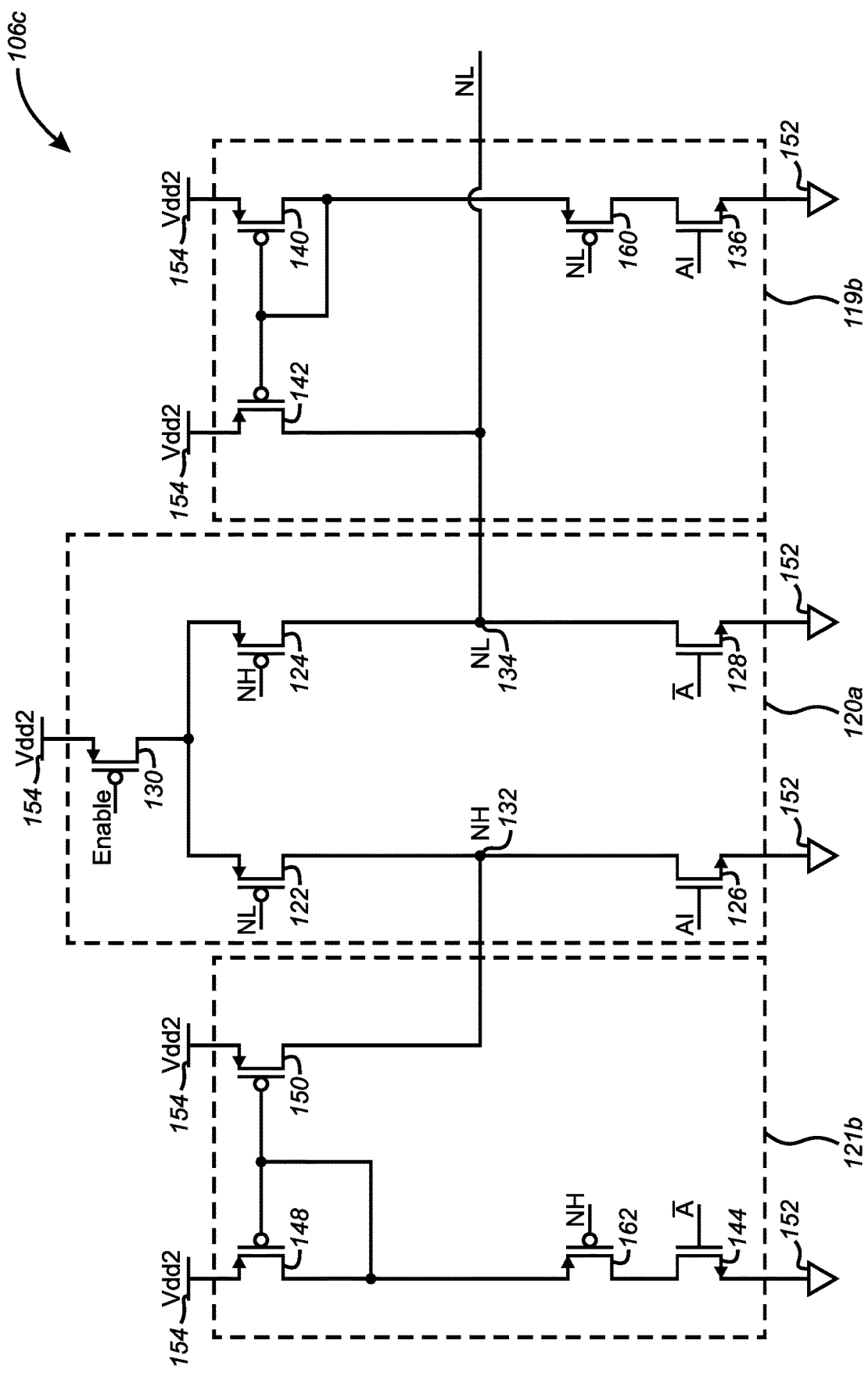
FIG. 5 shows a level shifter in accordance with an embodiment.

FIG. 5 shows a level shifter 106c in accordance with an embodiment. The level shifter 106c includes the half-latch stage 120a described with reference to FIG. 3 and first and second auxiliary stages 119b, 121b. The first and second auxiliary stages 119b, 121b have respective second input transistors 160, 162 having controls terminals coupled to different nodes than the second input transistors 138, 146 of the first and second auxiliary stages 119a, 121a described with reference to FIG. 3. In particular, in the first auxiliary stage 119b, the second input transistor 160 has a control terminal coupled to the second node 134 rather than the first node 132. In the second auxiliary stage 121b, the second input transistor 162 has a control terminal coupled to the first node 132 rather than the second node 134.

In the first auxiliary stage 119b, detection that the first node 132 is pulled up to the second supply voltage (Vdd2) rather being pulled down to the reference voltage (as dictated by the first signal (AI)) is based on (or informed by) a voltage level of the second node 134 rather than the first node 132 itself. In times other than when the half-latch stage 120a transitions between states, the first and second nodes 132, 134 have complementary states, where either the first node 132 is pulled to the second supply voltage (Vdd2) and the second node 134 is pulled to the reference voltage or the first node 132 is pulled to the reference voltage and the second node 134 is pulled to the second supply voltage (Vdd2). Thus, the second input transistor 160 of the first auxiliary stage 119b becomes conductive (to allow for the current path) when the second node 134 is being pulled down to the reference voltage, whereas the first signal (AI) is to cause the second node 134 to be pulled to the second supply voltage (Vdd2).

The second auxiliary stage 121b allows current to flow to the first node 132 when the complementary first signal ($\overline{A}$) has the first voltage level and the first node 132 is pulled down to the reference voltage. The second auxiliary stage 121b blocks current flow when the complementary first signal ($\overline{A}$) has the first voltage level and the first node 132 is correspondingly pulled up to the second supply voltage (Vdd2).

Figure 6:
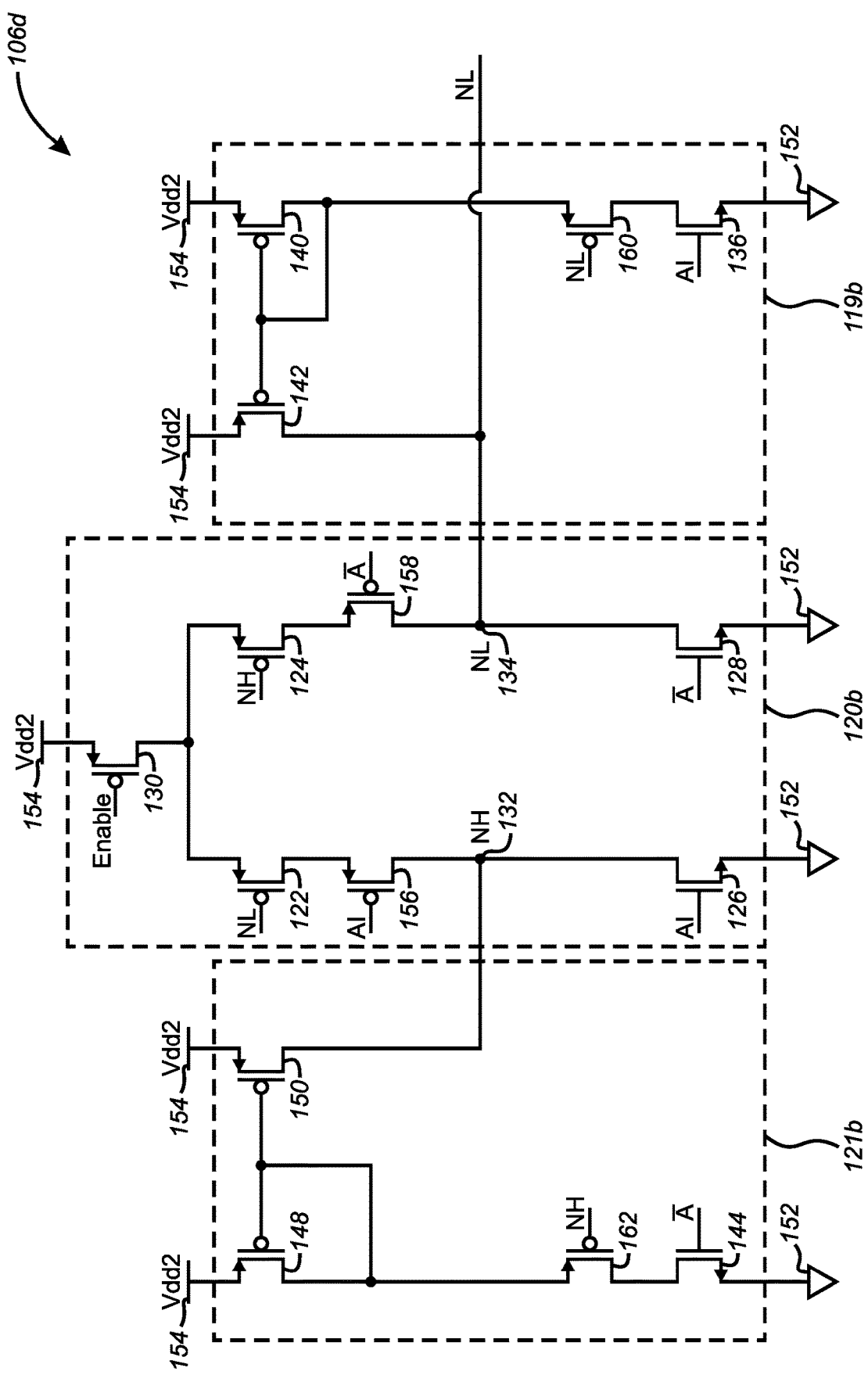
FIG. 6 shows a level shifter in accordance with an embodiment.

FIG. 6 shows a level shifter 106d in accordance with an embodiment. The level shifter 106d includes the half-latch stage 120b described with reference to FIG. 4 and the first and second auxiliary stages 119b, 121b described with reference to FIG. 5. Thus, the half-latch stage 120b of the level shifter 106c includes the third and fourth input transistors 156, 158 which operate to aid in removing the second supply voltage (Vdd2) from the first and second nodes 132, 134, respectively. Additionally, the first and second auxiliary stages 119b, 121b determine whether to block or permit current flow based on the voltage levels of the second node 134 and the first node 132, respectively.

The first auxiliary stage 119a, 119b and the second auxiliary stage 121a, 121b may permit current flow non-concurrently. The first auxiliary stage 119a, 119b permits current flow to aid in cutting off the first node 132 from the second supply voltage (Vdd2). When the first auxiliary stage 119a, 119b is permitting current flow, the level shifters 106a, 106b, 106c, 106d may be configured to cause the second auxiliary stage 121a, 121b to cease current flow to the first node 132 or ensure that the second auxiliary stage 121a, 121b does not supply current to the first node 132. Supplying current by the second auxiliary stage 121a, 121b to the first node 132 counteracts the function of the first auxiliary stage 119a, 119b of cutting off the first node 132.

To reduce dynamic power, the current mirror of the first auxiliary stage 119a, 119b is controlled based on a node voltage of the second auxiliary stage 121a, 121b and the current mirror of the second auxiliary stage 121a, 121b is controlled based on a node voltage of the first auxiliary stage 119a, 119b as described herein with reference FIGS. 7-10.

Figure 7:
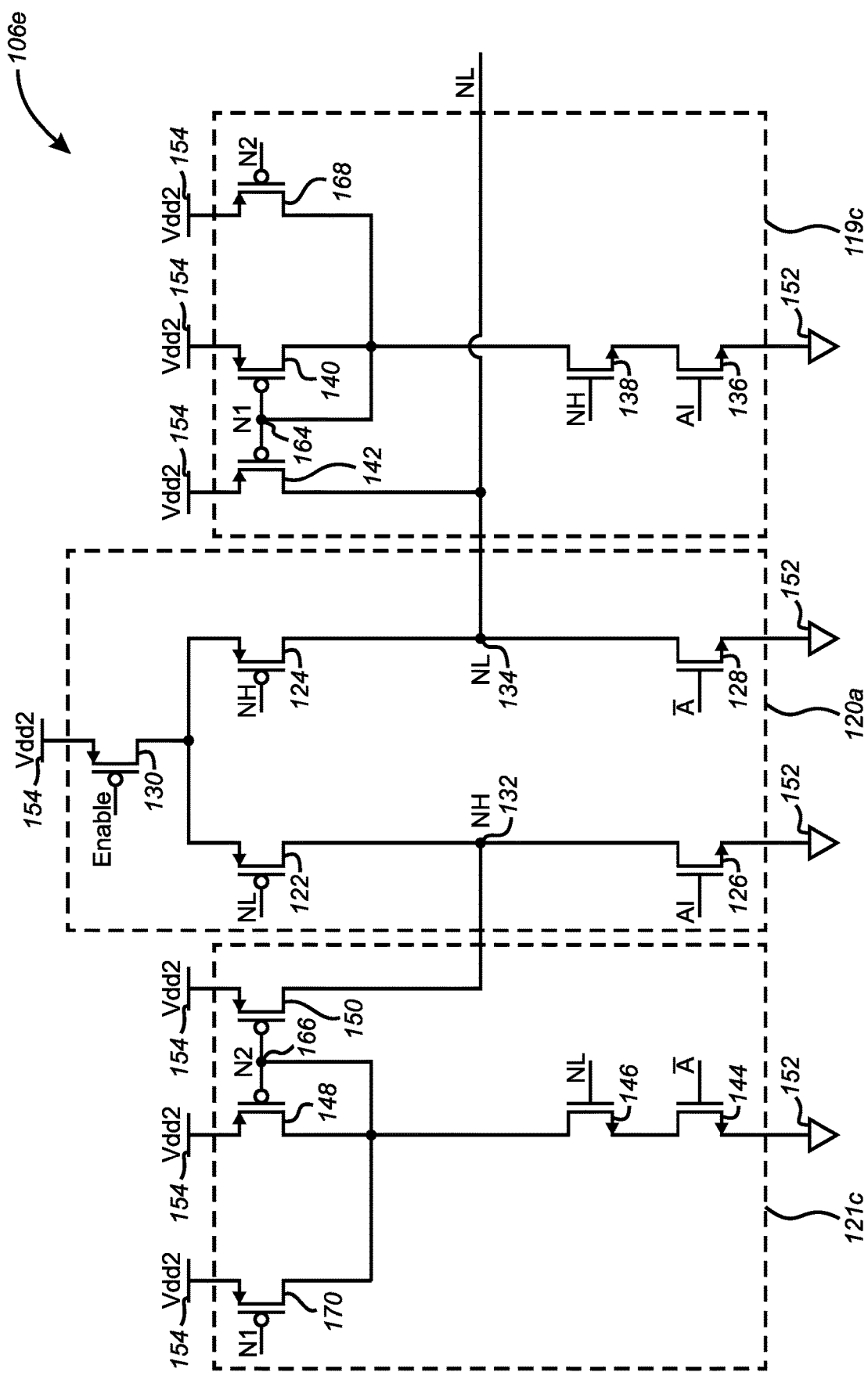
FIG. 7 shows a level shifter in accordance with an embodiment.

FIG. 7 shows a level shifter 106e in accordance with an embodiment. The level shifter 106e includes the half-latch stage 120a described with reference to FIG. 3 and first and second auxiliary stages 119c, 121c. The first auxiliary stage 119c includes a first current mirror node 164 (denoted 'N1'), and the second auxiliary stage 121c includes a second current mirror node 166 (denoted 'N2'). The first current mirror node 164 is coupled to the control terminal of the first current mirror transistor 140, the control terminal of the second current mirror transistor 142, the first conduction terminal of the first current mirror transistor 140 and the second conduction terminal of the second input transistor 138. In the second auxiliary stage 121c, the second current mirror node 166 is coupled to the control terminal of the first current mirror transistor 148, the control terminal of the second current mirror transistor 150, the first conduction terminal of the first current mirror transistor 148 and the second conduction terminal of the second input transistor 146.

The first auxiliary stage 119c includes a third current mirror transistor 168. The third current mirror transistor 168 has a first conduction terminal coupled to the first current mirror node 164. The third current mirror transistor 168 has a second conduction terminal coupled to the supply voltage node 154. The third current mirror transistor 168 has a control terminal coupled to the second current mirror node 166 of the second auxiliary stage 121c. The third current mirror transistor 168 is in a current mirror configuration with the first and second current mirror transistors 140, 142.

The second auxiliary stage 121c includes a third current mirror transistor 170. The third current mirror transistor 170 has a first conduction terminal coupled to the second current mirror node 166. The third current mirror transistor 170 has a second conduction terminal coupled to the supply voltage node 154. The third current mirror transistor 170 has a control terminal coupled to the first current mirror node 164 of the first auxiliary stage 119c. The third current mirror transistor 170 is in a current mirror configuration with the first and second current mirror transistors 148, 150 of the second auxiliary stage 121c.

Thus, the first auxiliary stage 119c is driven by the first signal (AI) provided to the half-latch stage 120a and the voltage of the first node 132 of the half-latch stage 120a as well as a voltage of the second current mirror node 166 of the second auxiliary stage 121c. The second auxiliary stage 121c is driven by the complementary first signal ($\overline{A}$) provided to the half-latch stage 120a and the voltage of the second node 134 of the half-latch stage 120a as well as a voltage of the first current mirror node 164 of the first auxiliary stage 119c.

The third current mirror transistors 168, 170 improve the power consumption of the level shifter 106e. During operation, the first auxiliary stage 119c passes current through the first and second current mirror transistors 140, 142 as described herein to pull a voltage level of the second node 134 up to the second supply voltage (Vdd2). The passage of current through the first current mirror transistor 140 raises the voltage of the first current mirror node 164, which is coupled to the first conduction terminal of the first current mirror transistor 140.

Concurrently, the level shifter 106e controls the second auxiliary stage 121c to cause the second auxiliary stage 121c to refrain from passing current to the first node 132 (and pulling a voltage of the first node 132 to the second supply voltage (Vdd2)). In the event that the first and second current mirror transistors 148, 150 of the second auxiliary stage 121c are conductive and allowing current passage to the first node 132, the third current mirror transistor 170 aids in and hastens stopping the current flow through the second auxiliary stage 121c. The third current mirror transistor 170 is controlled by a voltage of the first current mirror node 164 of the first auxiliary stage 119c. If the voltage rises due to current passage in the first auxiliary stage 119c, the third current mirror transistor 170 becomes non-conductive. The third current mirror transistor 170 is in a current mirror configuration with the first and second current mirror transistors 148, 150. Thus, the transition of the third current mirror transistor 170 to non-conductivity aids in causing the first and second current mirror transistors 148, 150 to become non-conductive. Consequently, the control of the third current mirror transistor 170 causes current flow in the second auxiliary stage 121c to cease.

Thus, in the event that the first and second input transistors 144, 146 are conductive thereby resulting in current flow in the second auxiliary stage 121c, the operation of the third current mirror transistor 170 overrides the first and second input transistors 144, 146 and expedites stopping current flow to the first node 132. Consequently, the power consumption of the level shifter 106e is reduced.

Similar operation occurs in the first auxiliary stage 119c. In the event that the first and second input transistors 136, 138 are conductive thereby resulting in current flow in the first auxiliary stage 119c, the operation of the third current mirror transistor 168 overrides the first and second input transistors 136, 138 and expedites stopping current flow to the second node 134. Thus, if the voltage of the second current mirror node 166 rises (as a result of the current passage from the second auxiliary stage 121c to the first node 132), the third current mirror transistor 168 transitions to non-conductivity. Consequently, the current mirror of the first auxiliary stage 119c becomes non-conductive and current supply to the first node 134 is ceased or reduced.

Figure 8:
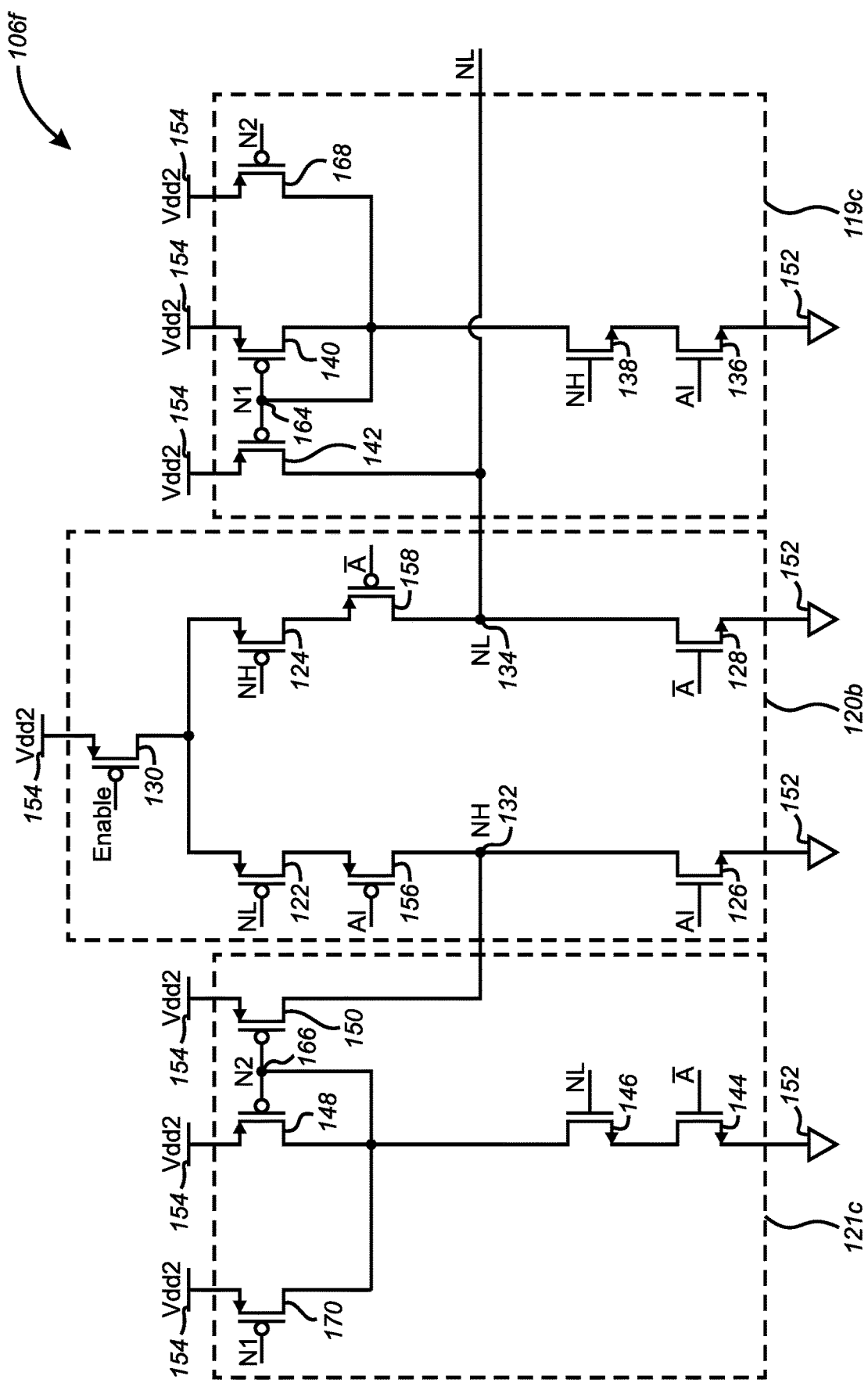
FIG. 8 shows a level shifter in accordance with an embodiment.
Figure 9:
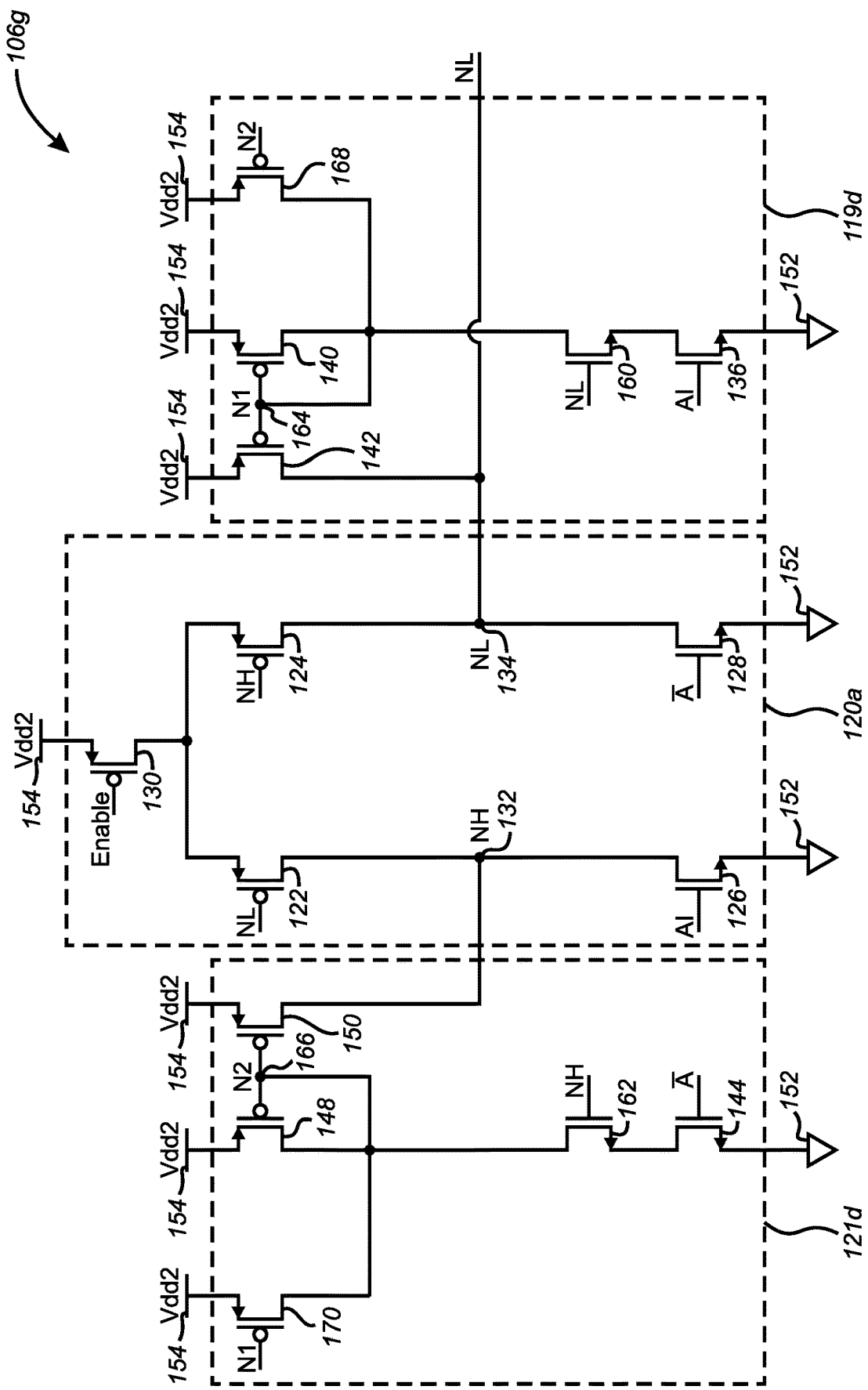
FIG. 9 shows a level shifter in accordance with an embodiment.

FIG. 8 shows a level shifter 106f in accordance with an embodiment. The level shifter 106f includes the half-latch stage 120b described herein with reference to FIGS. 4 and 6 and the first and second auxiliary stages 119c, 121c described with reference to FIG. 7. The first and second auxiliary stages 119c, 121c include the third current mirror transistors 168, 170, respectively. The third current mirror transistors 168, 170 aid in hastening the transition of the current mirrors of the first and second auxiliary stages 119c, 121c, respectively, to cease permitting current flow. FIG. 9 shows a level shifter 106g in accordance with an embodiment. The level shifter 106g includes the half-latch stage 120a described herein with reference to FIGS. 3 and 5 and first and second auxiliary stages 119d, 121d. The first and second auxiliary stages 119d, 121d have respective second input transistors 160, 162 having controls terminals coupled to different nodes than the second input transistors 138, 146 of the first and second auxiliary stages 119c, 121c described with reference to FIG. 7. The first and second auxiliary stages 119d, 121d include the third current mirror transistors 168, 170, respectively.

Figure 10:
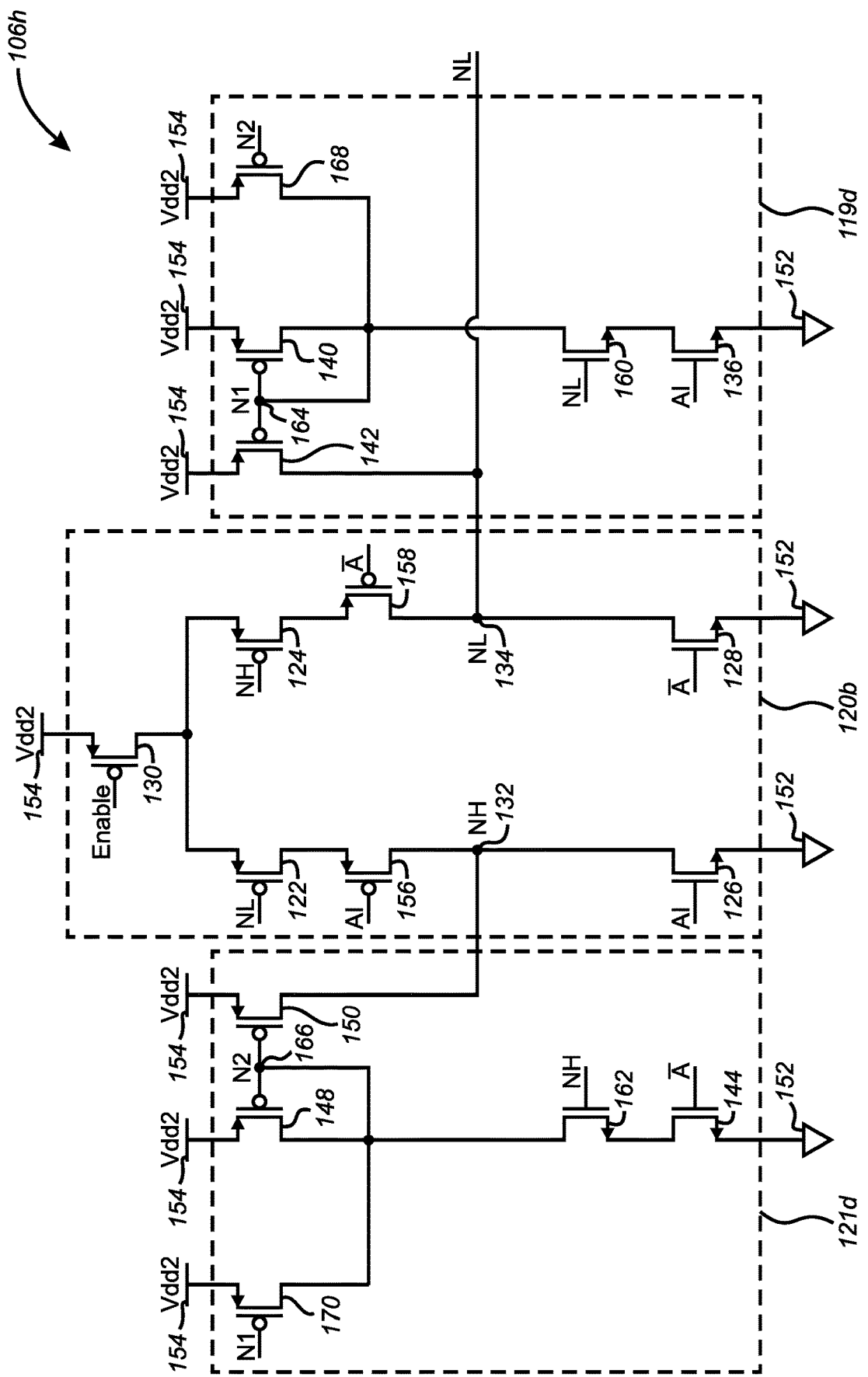
FIG. 10 SHOWS A LEVEL SHIFTER IN ACCORDANCE WITH AN EMBODIMENT.

FIG. 10 shows a level shifter 106h in accordance with an embodiment. The level shifter 106h includes the half-latch stage 120b described herein with reference to FIGS. 4 and 6 and the first and second auxiliary stages 119d, 121d having controls terminals coupled to different nodes than the second input transistors 138, 146 of the first and second auxiliary stages 119c, 121c.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A level shifter, comprising:
    a level shifting stage including first and second nodes, the level shifting stage being configured to receive a first signal from a first voltage domain and output a second signal to a second voltage domain; and
    a first auxiliary stage configured to:
        receive the first signal;
        in response to the first signal having a first voltage level corresponding to a first logical state and the first node having a supply voltage level, provide current to the second node to transition the first node to a reference voltage; and
        in response to the first signal having the first voltage level and the first node having the reference voltage, stop current flow to the second node.

2. The level shifter of claim 1, wherein the first auxiliary stage includes:
    a first current mirror coupled to the second node;
    a first input transistor configured to receive the first signal; and
    a second input transistor coupled to the first node,
    wherein the first and second input transistors are configured to: in response to the first signal having the first voltage level and the first node having the supply voltage level, transition to a conductive state to cause the first current mirror to provide the current to the second node.

3. The level shifter of claim 1, comprising:
    a second auxiliary stage configured to:
        receive a complementary first signal, the complementary first signal being complementary to the first signal; and
        in response to the complementary first signal having the first voltage level and the second node having the supply voltage level, provide current to the first node to accelerate a transition of the second node to the reference voltage.

4. The level shifter of claim 3, wherein the second auxiliary stage includes:
    a first current mirror coupled to the first node;
    a first input transistor configured to receive the complementary first signal; and
    a second input transistor coupled to the second node,
    wherein the first and second input transistors are configured to, in response to the complementary first signal having the first voltage level and the second node having the supply voltage level, transition to a conductive state to cause the first current mirror to provide the current to the first node.

5. The level shifter of claim 1, wherein the level shifting stage includes:
    a first input transistor configured to:
        receive the first signal; and
        in response to the first signal having the first voltage level, at least transition to a partially conductive state to at least partially couple the first node to a reference voltage node; and
    a second input transistor configured to:
        receive a complementary first signal; and
        in response to the complementary first signal having the first voltage level, at least transition to the partially conductive state to at least partially couple the second node to the reference voltage node.

6. The level shifter of claim 1, wherein the level shifting stage includes:
    a first input transistor configured to:
        receive the first signal; and
        in response to the first signal having the first voltage level, at least transition to a partially conductive state to at least partially decouple the first node from a supply voltage node; and
    a second input transistor configured to:
        receive a complementary first signal; and
        in response to the complementary first signal having the first voltage level, at least transition to the partially conductive state to at least partially decouple the second node from the supply voltage node.

7. The level shifter of claim 1, wherein the first signal is within a first voltage range of the first voltage domain and the second signal is within a second voltage range of the second voltage domain, and the first and second voltage domains are different.

8. The level shifter of claim 1, wherein the first voltage level is less than a threshold voltage of a transistor of the level shifting stage.

9. A method, comprising:
receiving, by a level shifting stage, a first signal from a first voltage domain;
receiving, by a first auxiliary stage, the first signal;
in response to the first signal having a first voltage level corresponding to a first logical state and a first node of the level shifting stage having a supply voltage level, sourcing current, by the first auxiliary stage, to a second node of the level shifting stage to accelerate a transition of the first node to a reference voltage, and in response to the first signal having the first voltage level and the first node having the reference voltage, stopping, by the first auxiliary stage, current flow to the second node; and
outputting, by the level shifting stage, a second signal to a second voltage domain.

10. The method of claim 9, further comprising:
receiving, by first and second input transistors of the first auxiliary stage, the first signal and a voltage of the first node, respectively; and
in response to the first signal having the first voltage level and the first node having the supply voltage level, transitioning, by the first and second input transistors, to a conductive state to cause a first current mirror to source the current to the second node.

11. The method of claim 9, further comprising:
receiving, by a second auxiliary stage, a complementary first signal, the complementary first signal being complementary to the first signal; and
in response to the complementary first signal having the first voltage level and the second node having the supply voltage level, sourcing, by the second auxiliary stage, current to the first node to transition the second node to the reference voltage.

12. The method of claim 9, further comprising:
receiving, by a first input transistor of the level shifting stage, the first signal;
in response to the first signal having the first voltage level, at least transitioning, by the first input transistor, to a partially conductive state to at least partially couple the first node to a reference voltage node;
receiving, by a second input transistor of the level shifting stage, a complementary first signal; and
in response to the complementary first signal having the first voltage level, at least transitioning, by the second input transistor, to the partially conductive state to at least partially couple the second node to the reference voltage node.

13. The method of claim 12, further comprising:
receiving, by a third input transistor of the level shifting stage, the first signal;
in response to the first signal having the first voltage level, at least transitioning, by the third input transistor, to a partially conductive state to at least partially decouple the first node from a supply voltage node;
receiving, by a fourth input transistor of the level shifting stage, a complementary first signal; and
in response to the complementary first signal having the first voltage level, at least transitioning, by the fourth input transistor, to the partially conductive state to at least partially decouple the second node from the supply voltage node.

14. A system, comprising:
a first voltage domain configured to output a first signal having a voltage within a first voltage range;
a second voltage domain configured to receive a second signal having a voltage within a second voltage range different from the first voltage range; and
a level shifter including:
a level shifting stage including first and second nodes and configured to receive the first signal and output the second signal; and
a first auxiliary stage configured to:
in response to the first signal having a first voltage level corresponding to a first logical state and the first node having a supply voltage level, source current to the second node to accelerate a transition of the first node to a reference voltage; and
in response to the first signal having the first voltage level and the first node having a reference voltage level, stop current flow to the second node.

15. The system of claim 14, wherein the level shifting stage includes:
a first input transistor configured to:
receive the first signal; and
in response to the first signal having the first voltage level, at least transition to a partially conductive state to at least partially couple the first node to a reference voltage node; and
a second input transistor configured to:
receive a complementary first signal; and
in response to the complementary first signal having the first voltage level, at least transition to the partially conductive state to at least partially couple the second node to the reference voltage node.

16. The system of claim 14, wherein the level shifting stage includes:
a first input transistor configured to:
receive the first signal; and
in response to the first signal having the first voltage level, at least transition to a partially conductive state to at least partially decouple the first node from a supply voltage node; and
a second input transistor configured to:
receive a complementary first signal; and
in response to the complementary first signal having the first voltage level, at least transition to the partially conductive state to at least partially decouple the second node from the supply voltage node.

* * * * *